United States Patent
Corse et al.

(10) Patent No.: US 10,305,518 B1
(45) Date of Patent: May 28, 2019

(54) CARTESIAN LOOP CIRCUITS, TRANSMITTERS, DEVICES, AND RELATED METHODS

(71) Applicant: MOTOROLA SOLUTIONS, INC., Chicago, IL (US)

(72) Inventors: Nir Corse, Rishon le-Zion (IL); Mark Rozental, Gedera (IL); Yaniv Salem, Kefar Saba (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/844,081

(22) Filed: Dec. 15, 2017

(51) Int. Cl.
  *H03F 1/32* (2006.01)
  *H03G 3/30* (2006.01)
  *H04B 1/04* (2006.01)

(52) U.S. Cl.
  CPC ............. *H04B 1/04* (2013.01); *H03G 3/3042* (2013.01); *H03F 1/3223* (2013.01); *H03F 1/3247* (2013.01); *H04B 2001/0416* (2013.01); *H04B 2001/0433* (2013.01); *H04B 2001/0441* (2013.01)

(58) Field of Classification Search
  CPC ........ H03F 1/3223; H03F 1/3247; H03F 1/34; H04B 2001/0408–2001/045; H03G 3/20; H03G 3/3042; H03G 2201/103; H03G 2201/106; H03G 2201/202; H03G 2201/302
  See application file for complete search history.

(56) References Cited

U.S. PATENT DOCUMENTS

| | | | | |
|---|---|---|---|---|
| 5,423,082 A * | 6/1995 | Cygan | ................... | H03F 1/3247 330/129 |
| 5,469,105 A * | 11/1995 | Sparks | ..................... | H03C 3/08 330/129 |
| 5,507,017 A | 4/1996 | Whitmarsh et al. | | |
| 5,574,992 A * | 11/1996 | Cygan | ................... | H03F 1/3247 330/129 |
| 6,463,264 B1 * | 10/2002 | Obara | .................. | H03G 3/3042 455/126 |
| 6,466,628 B1 * | 10/2002 | Kim | ....................... | H03C 3/406 330/284 |
| 8,964,892 B2 * | 2/2015 | Hansen | ................. | H03F 1/3247 375/294 |
| 2002/0171476 A1 * | 11/2002 | Yamamoto | ............. | H03C 3/406 330/10 |
| 2004/0110475 A1 * | 6/2004 | Korol | .................... | H04W 52/52 455/126 |

(Continued)

*Primary Examiner* — Duc M Nguyen
(74) *Attorney, Agent, or Firm* — Perry + Currier, Inc.

(57) ABSTRACT

A Cartesian loop circuit includes a reference signal amplifier, a forward path coupled to the reference signal amplifier, a feedback path coupled to the forward path, and a controller. The forward path includes an up-mixer to up mix a forward path signal to a radio frequency signal. The feedback path includes a down-mixer to down mix a feedback signal to a frequency of a baseband reference signal inputted to the forward path. The feedback path provides the down-mixed feedback signal to the forward path. The controller is to perform power control at a low power by controlling a gain of the reference signal amplifier and is to perform power control at a high power by controlling a gain of the down-mixer. At the high power, the controller may perform power control by further controlling the gain of the up-mixer.

16 Claims, 5 Drawing Sheets

(56) References Cited

U.S. PATENT DOCUMENTS

2006/0050810 A1\* 3/2006 Haque ................. H03F 1/34
375/297
2013/0051492 A1\* 2/2013 Hansen ............... H03F 1/3247
375/297

\* cited by examiner

CARTESIAN LOOP CIRCUITS, TRANSMITTERS, DEVICES, AND RELATED METHODS

BACKGROUND

Circuits with feedback loops are widely used in various applications, such as radiofrequency (RF) and microwave transmitters. Various digital modulation schemes are employed.

Digital linear modulation increases spectral efficiency when compared to non-linear modulation schemes. Transmitter non-linearity may cause transmitted output power to enter adjacent channels, and the amount of power in an adjacent channel is function of the linearity of the transmit path. Linearization of a power amplifier can be done using Cartesian feedback loops, which are capable of providing significant linearity in narrow bandwidth systems.

Cartesian feedback loops tend to be implemented using integrated circuits. Power control may be provided to Cartesian feedback loops for various reasons. For example, a transmitter may be operated at different power levels depending on various constraints.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
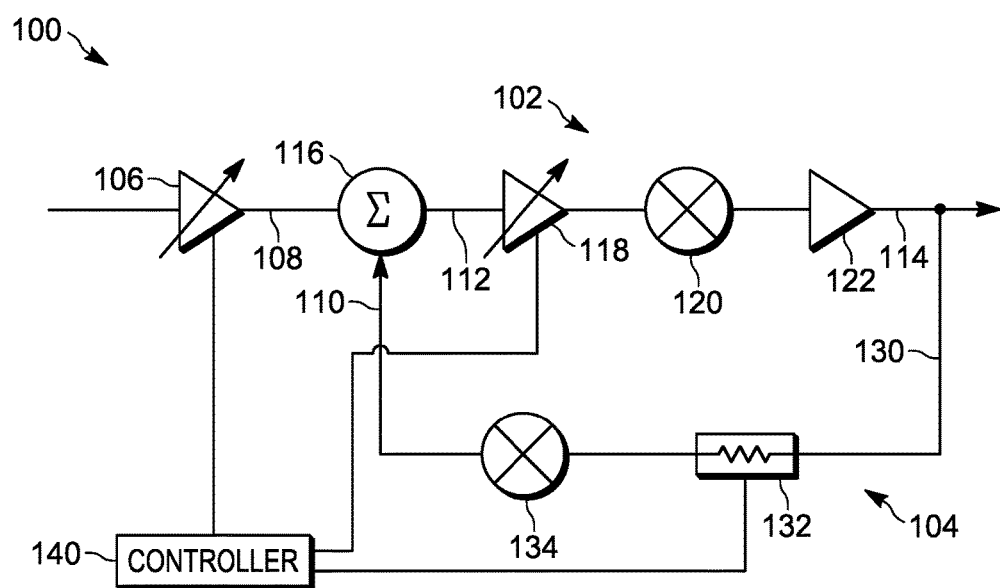
FIG. 1 is a schematic block diagram of a Cartesian loop circuit.

Elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

This disclosure concerns Cartesian loop circuits, transmitters, methods, and other devices, circuits, and systems that provide spatial efficiency on an integrated circuit and that reduce power consumption. Linear transmitter power control often requires high dynamic range output power. This tends to require variable gain up-mixers and down-mixers, which may consume relatively large circuit area and high current due to the need to provide high dynamic range output power. Down-mixer amplifiers are typically provided in the feedback path for the required dynamic range, which often results in the use of additional high-gain amplifiers at the up-mixer in the forward path. This disclosure provides reduced down-mixer and up-mixer circuit complexity and power consumption.

FIG. 1 shows a Cartesian loop circuit 100 according to an embodiment. At least some of the components of the circuit 100 may be provided as an integrated circuit.

The circuit 100 includes a forward path 102 and a feedback path 104 coupled to the forward path 102. The circuit 100 further includes a reference signal amplifier 106 coupled to the forward path 102. The reference signal amplifier 106 is configured to provide a baseband reference signal 108 as input to the forward path 102. The reference signal amplifier 106 may be considered part of the forward path 102.

The forward path 102 is configured to receive the baseband reference signal 108 from the reference signal amplifier 106, to receive a down-mixed feedback signal 110 from the feedback path 104, generate a corresponding forward path signal 112, and up-mix the forward path signal 112 to obtain a radio frequency signal 114.

In this embodiment, the forward path 102 includes a summation node 116 connected to an output of the reference signal amplifier 106, a forward path amplifier 118 connected to an output of the summation node 116, an up-mixer 120 connected to an output of the forward path amplifier 118, and an output amplifier 122 connected to an output of the up-mixer 120. The baseband reference signal 108 and the down-mixed feedback signal 110 are provided as inputs to the summation node 116, which outputs the forward path signal 112 to the forward path amplifier 118. The up-mixer 120 is configured to receive the forward path signal 112 from the forward path amplifier 118 and up mix the forward path signal 112 to the radio frequency signal 114. Further amplification of the radio frequency signal 114 may be performed by the output amplifier 122.

The feedback path 104 is configured to obtain a feedback signal 130 from the radio frequency signal 114 of the forward path 102, generate a corresponding down-mixed feedback signal 110, and provide the down-mixed feedback signal 110 to the forward path 102.

In this embodiment, the feedback path 104 includes an attenuator 132 and a down-mixer 134 connected to output of the attenuator 132. The attenuator 132 is configured to apply a variable gain attenuation to the feedback signal 130. The down-mixer 134 is configured to receive the feedback signal 130 from an output of the attenuator 132 and down mix the feedback signal 130 to a frequency of the baseband reference signal 108 to obtain a corresponding down-mixed feedback signal 110. The down-mixer 134 outputs the down-mixed feedback signal 110 to the summation node 116 of the forward path 102. It should be noted that the feedback path 104, in this embodiment, does not include an amplifier for the feedback signal 130.

Figure 4:
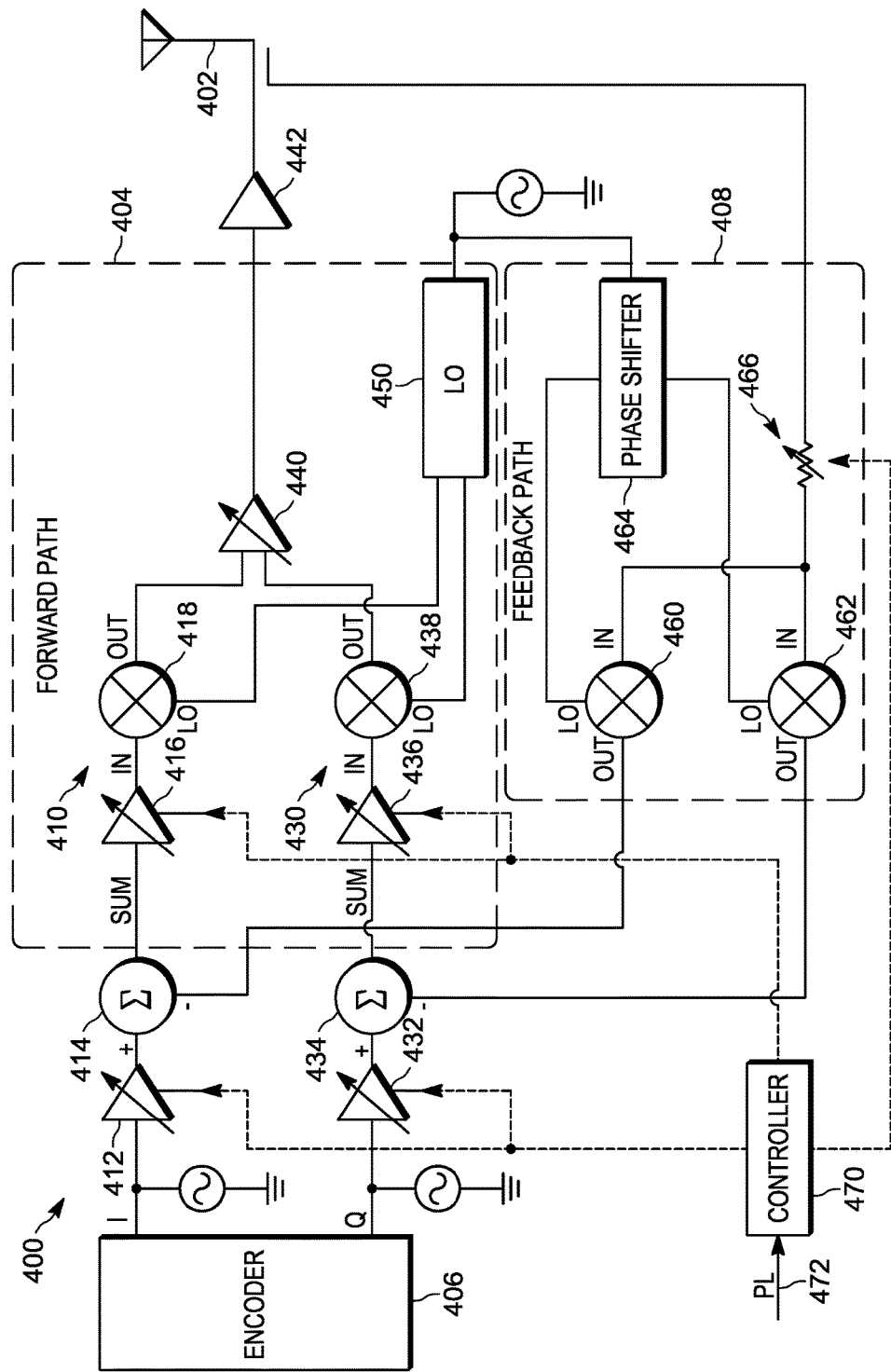
FIG. 4 is a schematic block diagram of a Cartesian loop transmitter device.

The circuit 100 further includes a controller 140 coupled to the reference signal amplifier 106 and the attenuator 132 in the feedback path 104. The controller 140 is configured to perform power control for the circuit 100 at a low power by controlling a gain of the reference signal amplifier 106 and to perform power control at a high power by controlling a gain of the down-mixer 134 by controlling attenuation (or generally the "gain") of the feedback signal 130 via the attenuator 132. The controller 140 may also be coupled to the forward path amplifier 118. The controller 140 may further be configured to perform power control at the high power by further controlling a gain at the up-mixer 120 via the forward path amplifier 118. The controller 140 may further be configured to activate Cartesian loop phase training at the high power and to deactivate Cartesian loop phase training at the low power. Cartesian loop phase training is done in order to find a local oscillator (LO) phase at which the Cartesian loop is stable. With reference to FIG. 4, the phase shifter 464 phase is adjusted during Cartesian loop phase training.

The low power and high power are not particularly constrained, except for the relative constraint that the high power be higher than the low power. The low and high powers may be distinguished by a threshold power level. In one example, a range of powers for the circuit 100 is 0 to 30 dBm and the threshold power level is 17.5 dBm. Power levels may be discrete levels, each of which is either a low power that is below the threshold power level or a high power that is above the threshold power level. For example, discrete levels may be every 5 dBm, with levels of 0, 5, 10, and 15 dBm falling below the threshold and with levels of 20, 25, and 30 exceeding the threshold. The threshold power level may be evaluated as any suitable kind of inequality, such as greater than, less than, greater than or equal to, less than or equal to. It should be recognized that various inequalities are equivalent. For example, in the above example scenario, greater than 17.5 dBm is equivalent to greater than or equal to 20 dBm. Moreover, power levels may be designated by arbitrary indicators, such as a scale from 0 to 6.

In an example operation, the controller 140 determines whether the circuit 100 is to operate at a high power by comparing a requested or operating power level to a threshold power level. If the operating power level is above the threshold power level, the controller 140 simultaneously changes gains of the up-mixer 120 and the down-mixer 134. For example, to increase power by 5 dBm the up-mixer 120 gain is increased by 5 dBm and simultaneously the down-mixer 134 gain is decreased by 5 dBm. To decrease power by, for example, 5 dBm, the up-mixer 120 gain is decreased by 5 dBm and simultaneously down-mixer 134 gain is increased by 5 dBm. This may maintain the open loop gain constant and may help with maintaining stability in the circuit 100. When the controller 140 changes gains of the up-mixer 120 and down-mixer 134, the controller 140 may further perform Cartesian loop phase training.

If the controller 140 determines that the operating power is below the threshold power level, during power control, the controller 140 changes the gain of the reference signal amplifier 106. For example, to increase power by 5 dBm, the controller 140 increases the gain of the reference signal amplifier 106 by 5 dBm. To decrease power by 5 dBm, the controller 140 decreases the gain of reference signal amplifier 106 by 5 dBm. When power control is performed by changing the gain of the reference signal amplifier 106, the controller need not perform Cartesian loop phase training. Further, when the controller 140 changes between power levels that are below the threshold power level by changing the gain of reference signal amplifier 106, there is no need to stop data transmission to perform Cartesian loop phase training. Thus, spectral efficiency may be increased.

Figure 2:
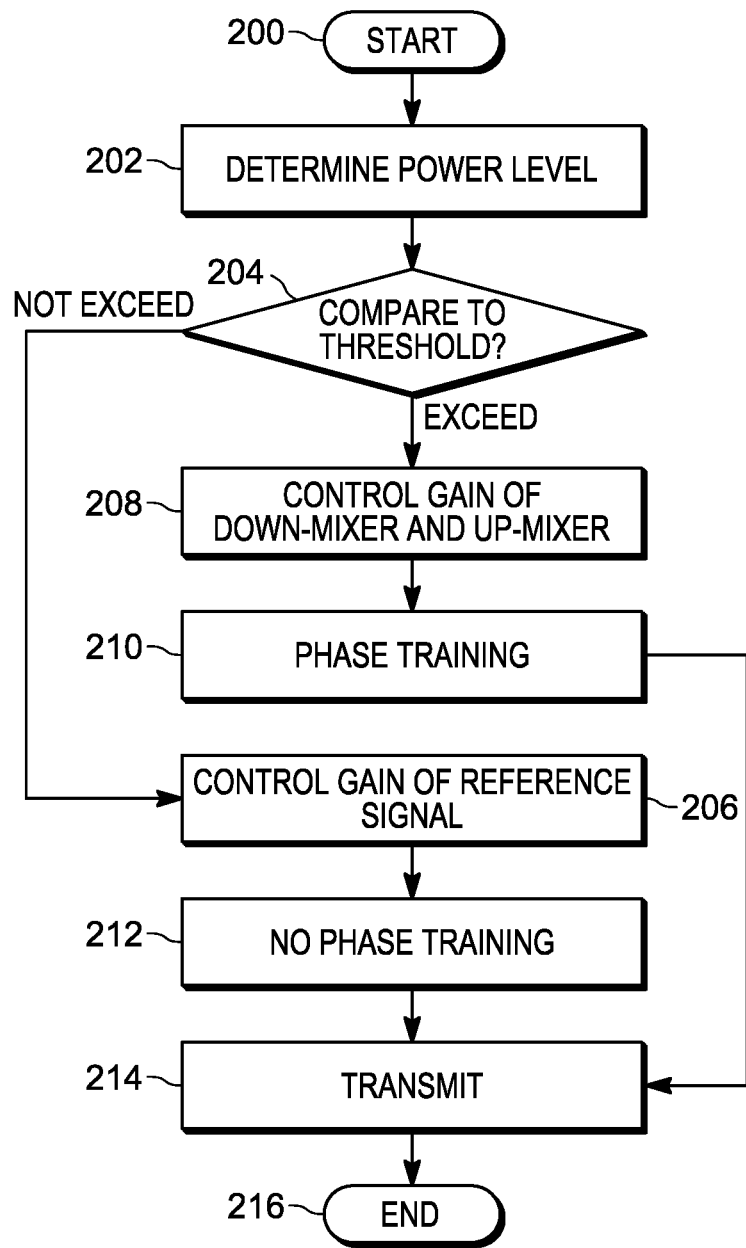
FIG. 2 is a flowchart of a method of power control in a Cartesian loop circuit.

FIG. 2 shows a flowchart of a method of performing power control in a Cartesian loop circuit, such as the circuit 100 or any of the other circuits and devices described herein. The method includes controlling a gain of a reference signal provided to a forward path of the Cartesian loop circuit based on a power level at which to operate the Cartesian loop circuit, and controlling a gain of a feedback signal in a feedback path of the Cartesian loop circuit based on the power level. The method may be used with the circuit 100 or with other circuits. For sake of explanation, the method will be described with reference to the circuit 100. The method begins at block 200.

At block 202, a power level at which to operate the circuit is determined. For example, the power level may be commanded by a source outside of the circuit. The power level may be a selected one of a plurality of discrete power levels. For example, a series of power levels may be established at discrete intervals (e.g., 5 dBm) and the selected power level may be indicated by an index to the series (e.g., 0 to 6).

At block 204, the power level is compared to a threshold power level. The threshold power level may be selected such that some discrete power levels fall below the threshold power level and the remaining discrete power levels exceed the threshold power level. That, is the threshold power level may split available power levels into high power levels and low power levels. Any number of high power levels and any number of low power levels may be used.

If the selected power level does not exceed the threshold power level, at block 206, a gain of a reference signal is controlled. Such a reference signal 108 may be outputted by a reference signal amplifier 106 whose gain is controlled. If the power level is to be increased, then the reference signal gain is increased. Conversely, if the power level is to be decreased, then the reference signal gain is decreased.

If the selected power level exceeds the threshold power level, at block 208, a gain of the feedback signal is controlled. This may include controlling a gain of an attenuator 132 in the feedback path to control the gain at the down-mixer 134. Further, a gain of a forward path amplifier 118 may be controlled to control the gain at the up-mixer 120. If an increase of power is required, then the gain of the down-mixer attenuator 132 may be decreased and the gain of the forward path amplifier 118 at the up-mixer 120 may be increased. Conversely, if a decrease of power is required, then the gain of the down-mixer attenuator 132 may be increased and the gain of the forward path amplifier 118 at the up-mixer 120 may be decreased.

At block 210, Cartesian loop phase training is activated and performed, when the power level exceeds the threshold power level. Conversely, Cartesian loop phase training is deactivated and not performed, at block 212, when the power level does not exceed the threshold power level.

The Cartesian loop circuit may be part of a transmitter, such as a transmitter in a terrestrial trunked radio (TETRA) system. As such, block 214 may include transmitting a radio signal at an antenna via the forward path.

The method ends at block 216. The method may be repeated continuously, at a predetermined interval, on demand, or according to another methodology.

Figure 3:
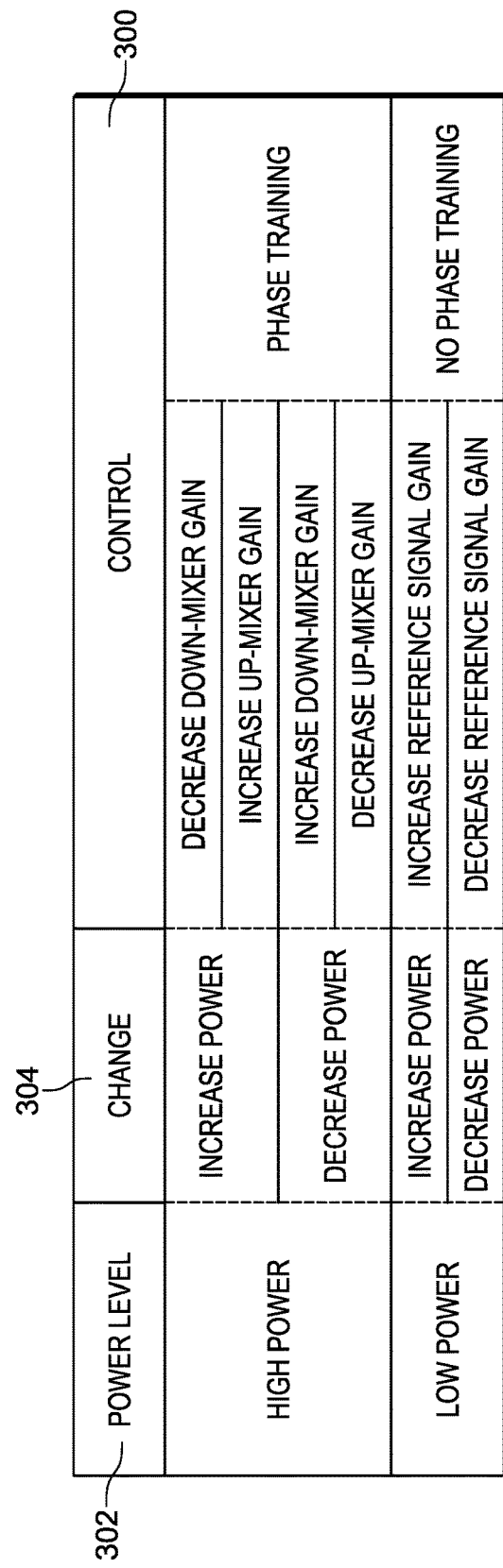
FIG. 3 is a table summarizing power controls.

FIG. 3 summarizes example controls 300 for a controller of a Cartesian loop circuit or device, such as those discussed herein, according to various embodiments. A power level 302 is compared to a threshold power level and then any changes 304 in power are made by controls 300 that may be executed by the controller. As can be seen, at high power levels, simultaneous control of gains of an up-mixer and down-mixer is performed, along with phase training. Up-mixer gain may be changed in the same sense as power level change, whereas down-mixer gain may be changed inverse to power level change. At low power levels, reference signal gain is controlled in the same sense as power level change.

FIG. 4 shows a Cartesian loop transmitter device 400 according to an embodiment. The transmitter device 400 includes components similar or identical to components of the circuit 100 of FIG. 1. Like reference numerals denote like components, and description for like components is not repeated here. At least some of the components of the device 400 may be provided on an integrated circuit.

The transmitter device 400 includes an antenna 402 coupled to an output of a forward path 404 and further includes an encoder 406 coupled to an input of the forward path 404. The encoder 406 may be a terrestrial trunked radio encoder and the antenna 402 may be configured accordingly. IQ modulation may be used. The transmitter device 400 further includes a feedback path 408.

The forward path 404 may include an in-phase path 410 and a quadrature path 430. Each path 410, 430 may be fed with a baseband reference signal I, Q that has a gain controlled by a reference signal amplifier 412, 432 and that is adjusted by a negative feedback signal at a summation node 414, 434. Further, each path 410, 430 may include a variable gain amplifier 416, 436 and up-mixer 418, 438, whose outputs are combined at output/power amplifiers 440, 442. A local oscillator circuit 450 may provide inputs to the up-mixers 418, 438.

The feedback path 408 may include down-mixers 460, 462 to provide negative feedback to the in-phase path 410 and a quadrature path 430, respectively. The feedback path 408 may further include a phase shifter 464 to provide local oscillator input to the down-mixers 460, 462. The feedback path 408 may further include variable attenuators 466 to provide a feedback signal to the inputs of the down-mixers 460, 462, the feedback signal being taken from the output of the forward path 404.

The Cartesian loop transmitter device 400 further includes a controller 470 configured to control the reference signal amplifiers 412, 432, up-mixer amplifiers 416, 436, and attenuators 466 according to the techniques discussed herein. The controller 470 may be configured to receive an inputted power level 472, such as an integer level (e.g., 0-6) for the transmitter device 400 and translate that power level 472 into control signals for the reference signal amplifiers 412, 432, up-mixer amplifiers 416, 436, and attenuators 466 as, for example, shown in FIG. 3. It should be noted that the feedback path 408 includes attenuators 466 for controlling the gain of the feedback signal provided the down-mixers 460, 462 and specifically does not include amplifiers for this purpose.

Figure 5:
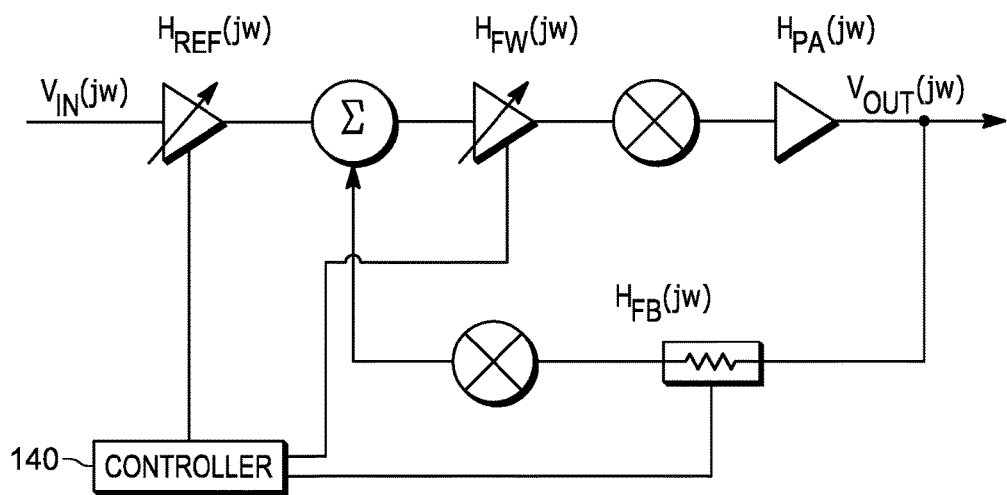
FIG. 5 is a schematic diagram of transfer functions of a Cartesian loop circuit.

With reference to FIG. 5, the techniques discussed herein achieve efficient power control by changing a reference transfer function $H_{REF}$ at low power levels and by changing a feedback transfer function $H_{FB}$ at high power levels using, for example, an attenuator in the feedback path. This provides flexibility by tailoring the overall transfer function to the transmitted output power. Further, a simplified architecture is possible due to control at low powers being applied at the reference transfer function $H_{REF}$. That is, down-mixer amplifiers in the feedback path may be omitted and up-mixer amplifiers may be correspondingly reduced. This may reduce overall size and complexity of the integrated circuit, as well as its power consumption. In addition, using a feedback attenuator to control power at high powers allows an adjacent channel power ratio (ACPR) specification to be more easily met, and a third-order intercept input point (IIP3) may be improved at the down-mixer. At low powers, the ACPR specification may be more relaxed and controlling power may be performed using a reference amplifier.

In addition, as reference gain control may be used at specific power levels, current consumption at specific power levels may be controlled. Further, reference gain control at low powers reduces or eliminates the need to perform phase training at low powers, which reduces or eliminates the need to cease transmission for phase training, as is often required in known systems. This may lead to greater efficiency in data transmission, particularly in continuous digital transmission schemes, such as in TETRA multi-slot packet data systems.

In the foregoing specification, specific embodiments have been described. However, various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. A Cartesian loop circuit comprising:
    a reference signal amplifier to provide a baseband reference signal;
    a forward path coupled to the reference signal amplifier to receive the baseband reference signal and obtain a forward path signal from the baseband reference signal and a down-mixed feedback signal, the forward path including an up-mixer to up mix the forward path signal to a radio frequency signal;
    a feedback path coupled to the forward path to obtain a feedback signal from the radio frequency signal of the forward path, the feedback path including a down-mixer to down mix the feedback signal to a frequency of the baseband reference signal, the feedback path further coupled to the forward path to provide the down-mixed feedback signal to the forward path; and a controller coupled to the reference signal amplifier and the feedback path, the controller to perform power control at a low power by controlling a gain of the reference signal amplifier and to perform power control at a high power that is higher than the low power by controlling a gain of the down-mixer.

2. The circuit of claim 1, wherein the controller is further coupled to the forward path, and wherein the controller is to perform power control at the high power by further controlling a gain at the up-mixer.

3. The circuit of claim 1, wherein the feedback path includes a variable attenuator and the controller is to control attenuation of the feedback signal.

4. The circuit of claim 1, wherein the controller is to activate Cartesian loop phase training at the high power and is to deactivate Cartesian loop phase training at the low power.

5. The circuit of claim 1, further comprising an antenna at an output of the forward path, the antenna to transmit the radio frequency signal.

6. A Cartesian loop transmitter device comprising:
an antenna;
a reference signal amplifier to provide a baseband reference signal;
a forward path including a forward path amplifier and a mixer, the forward path coupled to the reference signal amplifier, the forward path to up mix the baseband reference signal as combined with a down-mixed feedback signal to obtain a radio frequency signal;
a feedback path including an attenuator and a mixer, the feedback path coupled to the forward path to down mix a representation of the radio frequency signal and provide a down-mixed feedback signal to the forward path; and
a controller coupled to the reference signal amplifier and to the attenuator, the controller to control a gain of the reference signal amplifier and a gain of the attenuator based on a power level to transmit the radio frequency signal at the antenna;
wherein the controller is to decrease the gain of the attenuator when the power level is increased and is above a threshold power level; and
wherein the controller is further to control a gain of the forward path amplifier based on the power level.

7. The device of claim 6, wherein the controller is further to control a gain of the forward path amplifier based on the power level.

8. The device of claim 7, wherein the controller is to increase the gain of the forward path amplifier when the power level is increased and is above the threshold power level.

9. The device of claim 8, wherein the controller is to activate Cartesian loop phase training when the power level is above the threshold power level and to deactivate Cartesian loop phase training when the power level is below the threshold power level.

10. The device of claim 6, further comprising a terrestrial trunked radio encoder coupled to the forward path.

11. A method for power control in a Cartesian loop circuit, the method comprising:
performing power control of the Cartesian loop circuit at a low power by controlling a gain of a reference signal provided to a forward path of the Cartesian loop circuit based on a power level at which to operate the Cartesian loop circuit when the power level is below a threshold power level; and
performing power control of the Cartesian loop circuit at a high power that is higher than the low power by controlling a gain of a feedback signal in a feedback path of the Cartesian loop circuit based on the power level at which to operate the Cartesian loop circuit when the power level is above the threshold power level.

12. The method of claim 11, further comprising controlling a gain of a forward path amplifier based on the power level.

13. The method of claim 12, wherein controlling the gain of the forward path amplifier further comprises controlling the gain of the forward path amplifier when the power level is above the threshold power level.

14. The method of claim 11, further comprising activating Cartesian loop phase training when the power level is above the threshold power level and deactivating Cartesian loop phase training when the power level is below the threshold power level.

15. The method of claim 11, further comprising transmitting a terrestrial trunked radio signal via the forward path.

16. The method of claim 11, further comprising selecting the power level from an indexed series of discrete power levels that are above and below the threshold power level.

* * * * *